(12) United States Patent
Salsman et al.

(10) Patent No.: US 8,779,483 B2
(45) Date of Patent: Jul. 15, 2014

(54) SPECTRALLY TUNED PLASMONIC LIGHT COLLECTORS

(75) Inventors: Kenneth Edward Salsman, Pleasanton, CA (US); Ulrich Boettiger, Garden City, ID (US); Dmitry Bakin, San Jose, CA (US); Curtis W. Stith, Santa Cruz, CA (US)

(73) Assignee: Aptina Imaging Corporation, George Town (KY)

( * ) Notice: Subject to any disclaimer, the term of this patent is extended or adjusted under 35 U.S.C. 154(b) by 122 days.

(21) Appl. No.: 13/365,067

(22) Filed: Feb. 2, 2012

(65) Prior Publication Data

US 2012/0326256 A1     Dec. 27, 2012

Related U.S. Application Data

(60) Provisional application No. 61/440,118, filed on Feb. 7, 2011, provisional application No. 61/529,566, filed on Aug. 31, 2011.

(51) Int. Cl.
*H01L 31/02* (2006.01)
*H01L 27/146* (2006.01)

(52) U.S. Cl.
CPC .... *H01L 27/14625* (2013.01); *H01L 27/14603* (2013.01)
USPC .................................. 257/294; 257/E31.11

(58) Field of Classification Search
None
See application file for complete search history.

(56) References Cited

U.S. PATENT DOCUMENTS 6,040,936 A * 3/2000 Kim et al. ............ 359/245
6,236,033 B1 * 5/2001 Ebbesen et al. ........... 250/216

(Continued)

OTHER PUBLICATIONS

Sasagawa et al., "Dual-layer Metal-grid Polarized for Polarization Image Sensor in 65-nm CMOS Technology", 2012, 4 pages, IEEE.

(Continued)

*Primary Examiner* — Benjamin Sandvik
(74) *Attorney, Agent, or Firm* — Treyz Law Group; Louis R. Levenson; Michael H. Lyons

(57) ABSTRACT

Electronic devices may be provided with imaging modules that include plasmonic light collectors. Plasmonic light collectors may be configured to exploit an interaction between incoming light and plasmons in the plasmonic light collector to alter the path of the incoming light. Plasmonic light collectors may include one or more spectrally tuned plasmonic image pixels configured to preferentially trap light of a given frequency. Spectrally tuned plasmonic image pixels may include plasmonic structures formed form a patterned metal layer over doped silicon layers. Doped silicon layers may be interposed between plasmonic structures and a reflective layer. Plasmonic image pixels may be used to absorb and detect as much as, or more than, ninety percent of incident light at wavelengths ranging from the infrared to the ultraviolet. Plasmonic image pixels that capture light of different colors may be arranged in patterned arrays to form imager modules or imaging spectrometers for optofluidic microscopes.

13 Claims, 6 Drawing Sheets

(56) References Cited

U.S. PATENT DOCUMENTS

| | | | |
|---|---|---|---|
| 7,223,960 B2* | 5/2007 | Mouli | 250/226 |
| 7,423,254 B2* | 9/2008 | Arend et al. | 250/214.1 |
| 7,557,336 B2* | 7/2009 | Niigaki et al. | 250/214.1 |
| 2007/0007563 A1* | 1/2007 | Mouli | 257/292 |
| 2007/0258096 A1* | 11/2007 | Cui et al. | 356/521 |
| 2007/0262239 A1* | 11/2007 | Niigaki et al. | 250/208.1 |
| 2009/0146198 A1* | 6/2009 | Joe et al. | 257/292 |
| 2009/0323060 A1* | 12/2009 | Knipp | 356/327 |
| 2010/0270638 A1* | 10/2010 | Ahn | 257/437 |
| 2012/0211644 A1 | 8/2012 | Yang et al. | |

OTHER PUBLICATIONS

Catrysse et al., "Integrated Color Pixels in 0.18-um Complementary Metal Oxide Semiconductor Technology", 2003, 14 pages (2293-2036), vol. 20, No. 12, J. Opt. Soc, Am. A, Optical Society of America.

Chen et al., "High Transmission and Low Color Cross-talk Plasmonic Color Filters Using Triangular-lattice Home Arrays in Aluminum Films", 2010, 13 pages, vol. 18, No. 13, Optics Express, Optical Society of America.

* cited by examiner

SPECTRALLY TUNED PLASMONIC LIGHT COLLECTORS

This application claims the benefit of provisional patent application No. 61/440,118, filed Feb. 7, 2011, and provisional patent application No. 61/529,566, filed Aug. 31, 2011, which are hereby incorporated by reference herein in its entirety.

BACKGROUND

This relates generally to electronic devices, and more particularly, to electronic devices having plasmonic light collectors.

Plasmonic effects are quantum surface field effects in which an evanescent wave of electron density oscillations is generated on or near a surface of a metal or meta-material in response to incoming, incident light. In structures designed to exhibit plasmonic effects, incoming photons incident on the plasmonic structure generate plasmons associated with high intensity electromagnetic fields within nano-scale distances from the surface of the structure. These high intensity electromagnetic fields couple to the incoming photos and affect the path of travel of the photon near the plasmonic surface. These plasmonic effects may affect light of different frequencies differently. Plasmonic structures may therefore be useful in trapping or otherwise redirecting light of chosen frequencies.

Conventional electronic devices use microlenses formed in a silicon substrate to focus light onto image sensors that convert the light into electrical charge. Image pixels having microlenses formed from structures on a silicon substrate may have a limited efficiency with which light is transferred to the image sensor. Image pixels having microlenses formed from structures on a silicon substrate may require the formation of additional color elements in order to pass or reject light of a chosen color. Microlenses and additional color filter elements may require a volume of space that limits progress in producing smaller electronic devices and may provide limited efficiency in absorbing incident photons of some frequencies.

Plasmonic structures may be designed to reduce pixel size and increase light absorption efficiency in imaging systems in electronic devices.

It would therefore be desirable to be able to provide electronic devices with improved imaging systems.

DETAILED DESCRIPTION

Electronic devices such as digital cameras, computers, cellular telephones, optofluidic microscopes or other electronic devices widely include imaging modules for capturing image light or for performing spectral analyses. Imaging modules in these devices may use one or more lenses to focus incoming light onto corresponding image sensors in order to capture a corresponding digital image. Image sensors may include arrays of image sensor pixels. The pixels in the image sensors may include photosensitive elements such as photodiodes that convert the incoming light into digital data signals. Image sensors may have any number of pixels (e.g., hundreds or thousands or more). A typical image sensor may, for example, have millions of pixels (e.g., megapixels). In high-end equipment, image sensors with ten megapixels or more are not uncommon.

Figure 1:
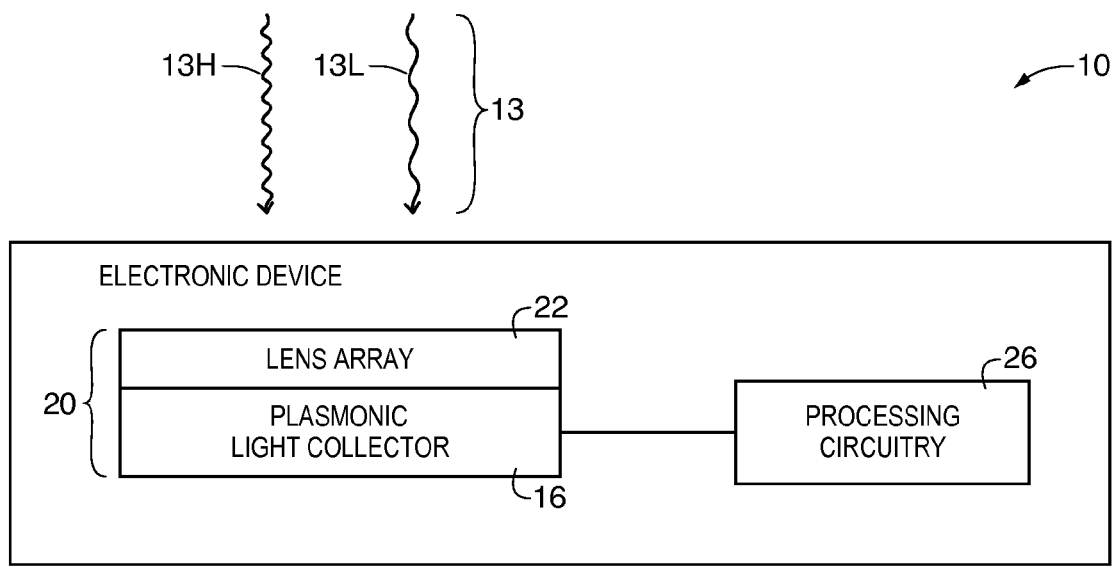
FIG. 1 is a diagram of an illustrative electronic device in accordance with an embodiment of the present invention.

FIG. 1 shows an electronic device in accordance with an embodiment of the present invention. As shown in FIG. 1, electronic device 10 may include an imaging module such as imaging module 20 for capturing an image and processing circuitry such as processing circuitry 26 for processing data and information captured by image module 20 or for performing other operations. Electronic device 10 of FIG. 1 may be a camera, cellular telephone, optofluidic microscope, computer, handheld device, portable computer, tablet computer, or other electronic equipment. Imaging module 20 may be configured to receive incoming image light 13 from an external object. Incoming light 13 may include light of multiple colors (frequencies) as represented by high frequency light 13H and low frequency light 13L of FIG. 1. Lenses in lens array 22 may be used to focus image light 13 onto a plasmonic light collector such as plasmonic light collector 16. Plasmonic light collectors 16 may contain an array of plasmonic image pixels that collect, filter and convert the image light into digital image data. The digital image data may be processed by processing circuitry 26.

Circuitry 26 may be incorporated into imaging module 20 and/or may be implemented using external processing circuitry (e.g., a microprocessor, an application-specific integrated circuit, etc.). Processing circuitry 26 may include one or more integrated circuits (e.g., image processing circuits, microprocessors, storage devices such as random-access memory and non-volatile memory, etc.) and may be implemented using components that are separate from imaging module 20 and/or that form part of imaging module 20 (e.g., circuits that form part of an integrated circuit that includes plasmonic light collector 16 or an integrated circuit within module 20 that is associated with plasmonic light collector 16). Image data that has been captured by imaging module 12 may be processed and stored using processing circuitry 26. Processed image data may, if desired, be provided to external equipment (e.g., a computer or other device) using wired and/or wireless communications paths coupled to processing circuitry 26.

Plasmonic light collector 16 may be a color-sensitive image sensor in which plasmonic image pixels may be individually configured to preferably accept a given color of light.

For example, plasmonic image pixels may be configured to preferably accept light having frequencies within a small window of frequencies (i.e., a single color of light), may be configure to preferably accept light having frequencies within multiple small frequency windows (i.e., multiple colors of light), may be configured to accept all colors of light, may be configure to accept light having a broad range of frequencies and reject light having other frequencies (e.g., to accept visible light and reject infrared light, to accept infrared light and reject visible light, etc.), or may be configure to accept light having any other suitable combination of frequencies. Plasmonic light collector 16 may have plasmonic image pixels that all accept the same color of light or may have plasmonic image pixels that accept different colors of light (e.g., plasmonic pixels that accept blue light may alternate with plasmonic pixels that accept green light in some pixel rows and in which plasmonic pixels that accept green light alternate with plasmonic pixels that accept red light in other rows). Arrangements in which plasmonic light collector 16 is a color-sensitive image sensor are sometimes described herein as an example.

To provide plasmonic light collector 16 with additional color filtering capability, plasmonic light collector 16 may be provided with a color filter array. As an example, image pixels of plasmonic light collector 16 may be associated with a pattern of color filter elements in which blue elements alternate with green elements in some rows and in which green elements alternate with red elements in other rows. Plasmonic light collectors having color filter array as described above is merely illustrative.

Figure 2:
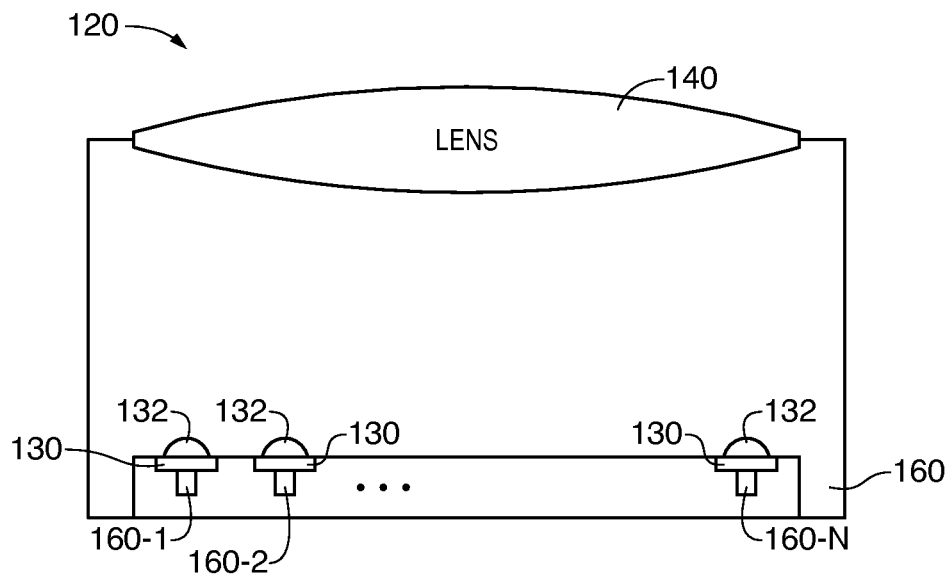
FIG. 2 is a cross-sectional side view of a conventional imaging device.

A diagram of a conventional imaging system with is shown in FIG. 2. In FIG. 2, camera module 120 has a lens 140 that focuses image light from onto corresponding image sensor 160. In a typical imaging system, image sensor 160 includes an array of image pixels 160-1, 160-2 . . . 160-N. Each image pixel in image sensor 160 typically includes a photosensitive element such as a photodiode. Image pixels 160-1, 160-2 . . . 160-N are each associated with a color filter element 130 and microlens 132. Light that has been focused by lens 140 onto image sensor 160 may be focused by microlenses 132 such that the light passes through color filter elements 130 and onto a corresponding image pixel of image sensor 160. Microlenses 132 and color filter elements 130 are typically formed on a silicon substrate may require a volume of space that prohibits development of smaller image pixels and may be limited in the efficiency with which light is absorbed (e.g., conventional image pixels such as pixel 120 may absorb only 10-40 percent of light of a given frequency incident upon it). Plasmonic structures (i.e., structures designed to exploit an interaction between incident light and plasmons associated with the structures) may be designed to reduce pixel size and increase light absorption efficiency in imaging systems in electronic devices.

Figure 3:
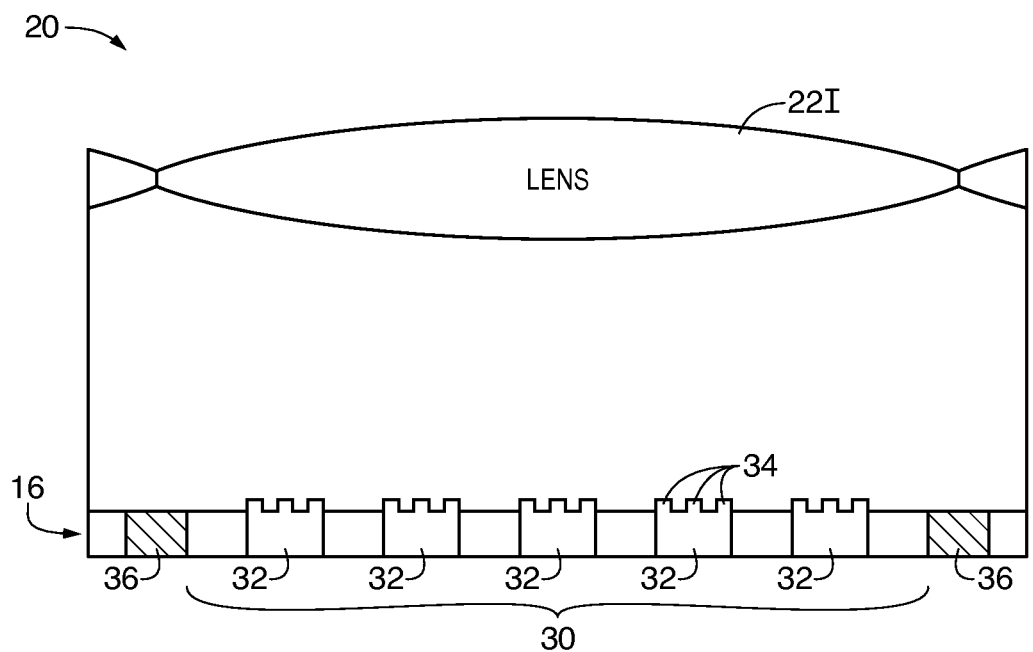
FIG. 3 is a cross-sectional side view of an illustrative imaging system having an array of plasmonic lenses in accordance with an embodiment of the present invention.

FIG. 3 is a cross-sectional side view of an imaging module such as imaging module 20 of electronic device 10 of FIG. 1. In the example of FIG. 3, lens array 22 may include one or more lenses 22I configured to focus light on the plasmonic light collector 16. Plasmonic light collector 16 may include an image sensor such as image sensor 30 having one or more plasmonic image pixels such as plasmonic image pixels 32. Plasmonic image pixels 32 may be configured such that surface plasmons resulting from evanescent waves of electrons generated by incoming photons interact with the incoming photons and affect the path of travel of the incoming photons. Plasmonic image pixels 32 may have surface features such as surface features 34. Surface features 34 of plasmonic image pixels 32 may be formed from material coatings or other structures formed (e.g., implanted, layered, screen printed, etched, lithographed, etc.) such that incoming photons are captured (trapped) within plasmonic image pixels 32. As an example, surface features 34 may be formed from a patterned metal layer having metal portions that cover portions of plasmonic image pixels 32 and openings that allow light to enter plasmonic image pixels 32. Plasmonic image pixels 32 may be configured to capture a light of a single color (e.g., red light, blue light, green light, infrared light, x-ray wavelength light, ultra-violet light, etc.) while rejecting light of another color, may be configured to capture a combination of individual colors, or may be configured to capture light having a wide continuous range of colors of light. Plasmonic image pixels 32 may be formed from one or more metal coating layers formed on a substrate (e.g., doped or un-doped silicon), may be formed by implanting material having one dielectric constant into another material having another dielectric constant, may be formed by layering materials of different dielectric constants or through other formation methods.

Plasmonic light collector 16 may have plasmonic image pixels 32 that all capture the same color of light or may have plasmonic image pixels that capture different colors of light (e.g., some pixels may be configured to capture blue light, some pixels may be configured to capture green light, some pixels may be configured to capture red light, some pixels may be configured to capture infrared light, etc.). Plasmonic light collector 16 may include plasmonic image pixels 32 arranged to form an array of plasmonic image pixels having a Bayer color pattern (i.e., pixels configured to capture blue light, green light, and red light may be arranged in an alternating Bayer color pattern). Plasmonic light collector 16 may include plasmonic image pixels 32 configure to capture multiple colors of light and arranged to form an imaging spectrometer (i.e., pixels that capture different colors of light may be arranged in rows of plasmonic image pixels such that an object scanned across the rows may be imaged in multiple different colors, as in an optofluidic microscope). Plasmonic light collector 16 may be formed from a single array of plasmonic image pixels 32 or may be formed from multiple arrays of plasmonic image pixels separated using housing structures such as structure 36 and each having a corresponding lens 22I in lens array 22. As an example, electronic device 10 (see FIG. 1) may include a lens array having four lenses such as lens 22I and a plasmonic light collector such as plasmonic light collector 16 having four corresponding arrays of plasmonic image pixels such as pixels 32. In the example of a four lens, four array device, one array of plasmonic image pixels may be configured to capture red light, one array of plasmonic image pixels may be configured to capture blue light, one array of plasmonic image pixels may be configured to capture green light and one array of plasmonic image pixels may be configured to capture infrared light. The example of a device having four lenses and four arrays is merely illustrative. Device 10 may have more or less than four lenses and more or less than four arrays of plasmonic image pixels.

Plasmonic image pixels 32 may include one or more photosensitive elements such as photodiodes (light sensors) for converting captured light into electrical charge. Plasmonic image pixels 32 may include components such as reset transistors, charge storage nodes (also referred to as floating diffusion FD nodes), transfer transistors (transfer gates), or other components. Signals associated with the charge converted by a photodiode (sometimes referred to herein as image data) may be conveyed to processing circuitry 26 of electronic device 10 (see FIG. 1) through components such as row select transistors, source-follower transistors, or other components. Image data that has been captured by imaging module 20 may be processed and stored using processing circuitry 26. Processed image data may, if desired, be provided to external equipment (e.g., a computer or other device) using wired and/or wireless communications paths coupled to processing circuitry 26.

Figure 4:
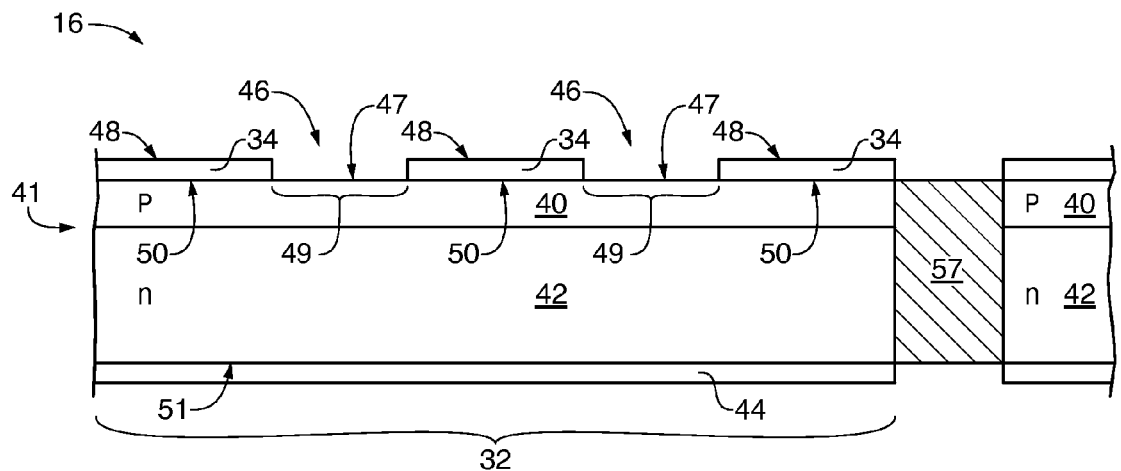
FIG. 4 is a cross-sectional side view of an illustrative plasmonic image pixel in accordance with an embodiment of the present invention.

Plasmonic image pixels 32 of plasmonic light collector 16 may include a p-type doped semiconductor layer such as p-type doped semiconductor layer 40 (sometimes referred to herein as p-type semiconductor layer 40 or p-type layer 40) formed on an n-type doped semiconductor layer such as n-type doped semiconductor layer 42 (sometimes referred to herein as n-type semiconductor layer 42 or n-type layer 42) as shown in FIG. 4. P-type layer 40 and n-type layer 42 may form p-n junction 41 such that a portion of p-n junction 41 may be used to form a photodiode (light sensor) for detecting light captured by plasmonic image pixel 32. Plasmonic image pixels 32 may be separated, as shown in FIG. 4 by separating structures such as separation structure 57. Separating structures 57 may be, for example, a disruptive implant formed from dielectric material such as silicon or other acceptable materials that have been processed to form barriers between components of each pixel 32.

Plasmonic image pixels 32 may include a reflective layer such as reflective layer 44 formed on bottom surface 51 of n-type layer 42. Reflective layer 44 may be formed from any suitable reflective material (e.g., gold plating, gold coating or other reflective material). Each plasmonic image pixel 32 may include surface features 34 and exposed regions 49 on upper surface 47 of p-type layer 40. Surface features 34 may, as an example, be formed from a patterned metal layer over p-type layer 40 (i.e., surface features 34 may be formed on surface 47 of p-type layer 40 by depositing a layer of a noble metal (e.g., a gold or other metal layer) on p-type layer 40 and using e-beam lithography or other patterning methods to form openings such as openings 46 in the metal layer resulting in exposed portions 46 of upper surface 47 of p-type layer 40 not covered by the metal layer). Openings 46 in patterned metal layer 34 may be configured to allow light incident on pixel 32 to enter pixel 32 (i.e., to enter p-type dielectric layer 40 through exposed regions 49 of surface 47 not covered by patterned metal layer 34). Reflective layer 44 may be configured such that light that enters plasmonic image pixel 32 through exposed portions 49 is reflected off of reflective layer 44 back towards openings 46 and metal layer 34. Electromagnetic fields generated near surface features 34 due to plasmons generated on outer surface 48 and inner surface 50 of surface features 34 may cause incoming light directed at surface features 34 to be redirected toward openings 46 and may cause light reflected off of reflective layer 44 towards openings 46 to be redirected toward inner surface 50 of patterned metal layer 34 as shown in FIG. 5.

Figure 5:
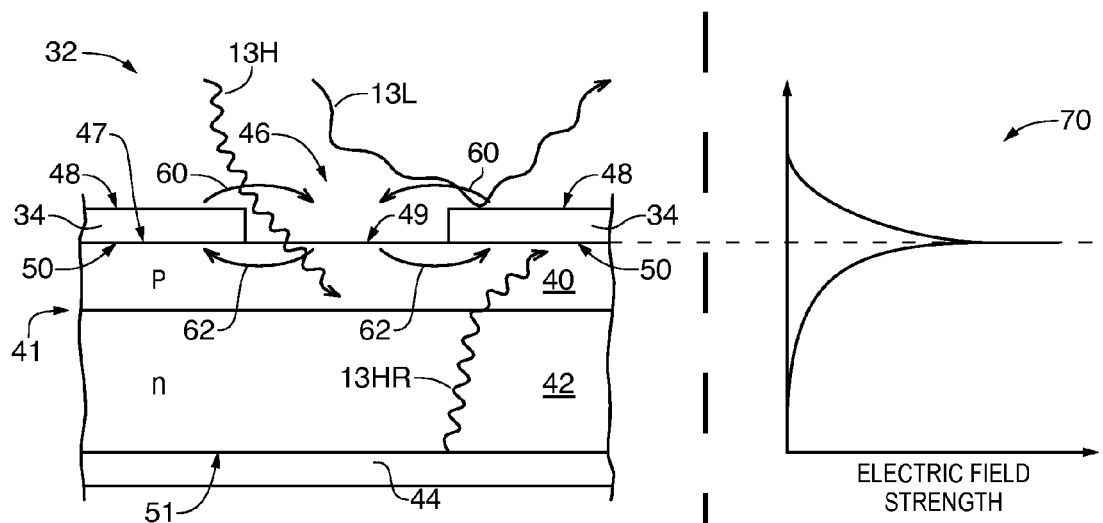
FIG. 5 is a cross-sectional side view of a portion of a spectrally tuned illustrative plasmonic image pixel of the type shown in FIG. 4, in accordance with an embodiment of the present invention.

FIG. 5 is a cross-sectional diagram of a portion of a plasmonic image pixel such as plasmonic image pixel 32 of FIG. 4 that illustrates the light trapping mechanism of plasmonic image pixel 32. As described in connection with FIG. 4, plasmonic image pixel 32 may have a photodiode partially formed from p-n junction 41 formed at the interface of p-type layer 40 and n-type layer 42. Plasmonic image pixel 32 may include a reflective layer formed on bottom surface 51 of n-type layer 42. Plasmonic image pixel 32 may include a patterned metal (e.g., a noble metal such as gold, silver, etc.) layer such as layer 34 having inner surface 50 and outer surface 48. Inner surface 50 of metal layer 24 may be formed in contact with upper surface 47 of p-type layer 40. Electronic device 10 (see FIG. 1) may be configured such that plasmonic image pixels 32 of plasmonic light collector 16 are exposed to light 13 of various frequencies such as low frequency light 13L (i.e., light in a frequency range having relatively low frequencies) and high frequency light 13H (i.e., light in a frequency range having relatively high frequencies) from above as shown in FIG. 5. For example, high frequency light 13H may be incident on patterned metal layer 34. Plasmons may be generated in outer surface 48 or inner surface 50 of metal layer 34 in response to high frequency light 13H. Plasmons generated on outer surface 48 or inner surface 50 may interact with high frequency light 13H such that high frequency light 13H is redirected away from metal layer 34 and into opening 46 (as indicated by arrows 60) in p-type semiconductor layer 40. As shown in FIG. 5, high frequency light 13H may be reflected by reflective layer 44 back toward opening 46 in metal layer 34. Plasmons may be generated on inner surface 50 or outer surface 48 of metal layer 34 in response to reflected high frequency light 13HR. Plasmons generated on inner surface 50 or outer surface 48 of metal layer 34 may interact with reflected high frequency light 13HR such that reflected high frequency light 13HR is redirected away from opening 46 toward inner surface 50 of metal layer 34 (as indicated by arrows 62). Therefore, once light has entered semiconductor layers 40 and 42 of plasmonic pixel 32, the light cannot escape and becomes trapped. Trapped light may reflect multiple times within plasmonic image pixel 32 before ultimately begin absorbed by the semiconductor layers and generating a detectable charge.

During operation of plasmonic image pixel 32, low frequency light such as low frequency light 13L may be emitted toward opening 46 in patterned metal layer 34. Plasmons may be generated in outer surface 48 or inner surface 50 of metal layer 34 in response to low frequency light 13L. Plasmons generated on outer surface 48 or inner surface 50 may interact with low frequency light 13L such that low frequency light 13L is redirected away from opening 46 and toward metal layer 34 (as indicated by arrows 60) so that low frequency light 13L is prevented from entering exposed portions 49 of p-type semiconductor layer 40. As shown in FIG. 5, low frequency light 13L may be reflected by outer surface 48 of metal layer 34 and ultimately rejected by plasmonic image pixel 32. The example of a plasmonic image pixel 32 that captures high frequency light and rejects low frequency light is merely illustrative. Patterned metal layer 34 may be patterned or otherwise configured such that plasmonic image pixel 32 captures low frequency light and rejects high frequency light. Plasmonic image pixels 32 may be configured to capture low frequency light and to capture high frequency light. Plasmonic image pixel 32 may be configured to capture a wide range of frequencies of light or any suitable narrow range of frequencies of light.

Also shown in FIG. 5 is an illustrative graph of electric field strength as a function of distance from reflector 44. As shown in graph 70 of FIG. 5, the electric field strength associated with plasmons generated at the interface between metal layer 34 and p-type semiconductor layer 40 (i.e., at inner surface 50 of metal layer 34) has a cusp-like behavior (i.e., the electric field rises toward extremely large values at surface 50 and drops quickly to zero away from surface 50). Graph 70 indicates the powerful effect of plasmonic structures to effect electromagnetic radiation (light) in the vicinity of a surface of transition between materials of differing dielectric strength.

Figure 6:
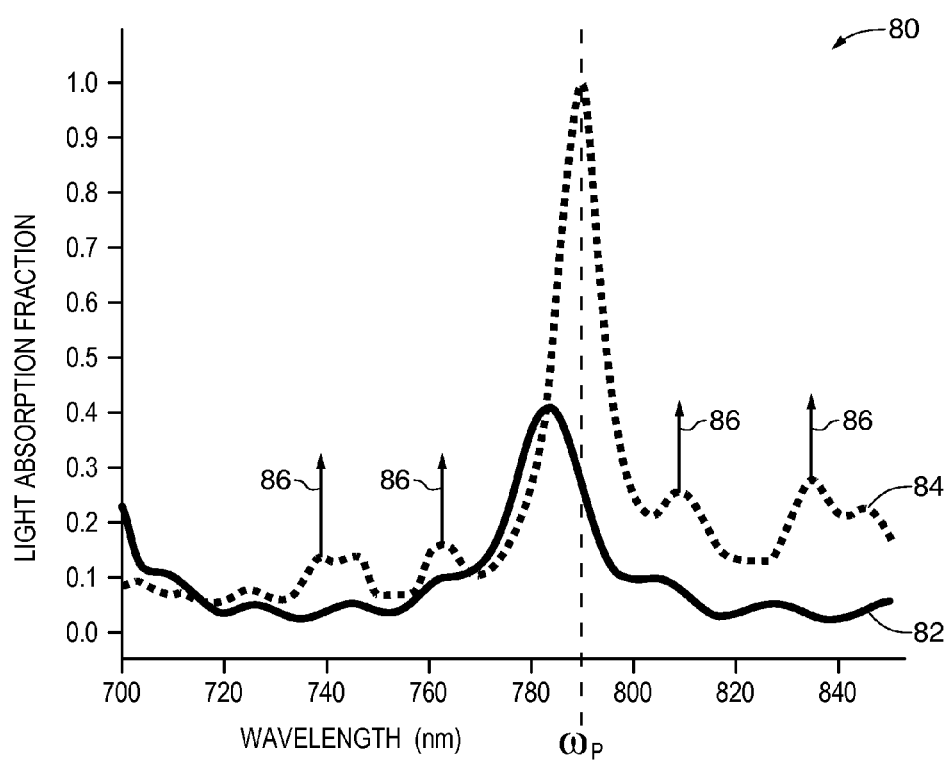
FIG. 6 is an illustrative graph showing increased light absorption efficiency of a plasmonic image pixel in accordance with an embodiment of the present invention.

FIG. 6 is an illustrative graph showing a simulated light absorption fraction of a light collector (i.e., the fraction of light that incident on a light collector that is absorbed by the collector) as a function of the wavelength (color) of the light. As shown by graph 80 of FIG. 6, curve 82 may be a light absorption curve for a non-plasmonic light collector (e.g., a conventional thin silicon absorber) and curve 84 may be a light absorption curve for a spectrally tuned plasmonic light collector of the type shown in FIGS. 4 and 5. As shown by non-plasmonic absorption curve 82, less than 10 percent of light incident on a light collector (e.g. a thin piece of silicon) may be absorbed by the collector in much of the visible range of wavelengths (e.g., wavelengths 720-760 nanometers (nm) and wavelengths greater than 820 nm). At the peak of absorption for a non-plasmonic light collector approximately 40 percent of light may be absorbed. In contrast, a plasmonic light collector of the type shown in FIGS. 1, 3, 4 and 5 may absorb a larger fraction of light at nearly all wavelengths. In particular, plasmonic structures such as metal layer 34 of FIG. 5 may be configured such that at a peak wavelength such as peak wavelength Wp, substantially all (e.g., greater than 90 percent) of light incident on a spectrally tuned plasmonic light collector may be absorbed. Increased efficiency of absorption of light by plasmonic light collectors such as plasmonic light collector 16 of FIG. 1 in comparison with conventional image sensors may have wide ranging applications for imaging and spectral analysis including imaging and spectral analysis systems such as imaging module 20 in electronic devices such as electronic device 10 (e.g., cameras, mobile phones, laptop computers, optofluidic microscopes, or other devices).

In addition to nearly total absorption at a selected peak wavelength such as wavelength Wp, plasmonic light collector 16 may be configure to increase light absorption at all wavelengths (as indicated by arrows 86 of FIG. 6) above the 20-30 percent absorption shown by illustrative absorption curve 84. Light absorption may be increased, relative to conventional devices, for light having a broad range of wavelengths by suitably configuring plasmonic structures such as metal layer 34 of plasmonic light collector 16. In the example of FIG. 6, peak wavelength Wp is shown to be in the range of 780-800 nanometers. This is merely illustrative. Patterned metal layer 34 may be configured to spectrally tune plasmonic image pixels 32 to have a peak absorption wavelength at any suitable wavelength (e.g., wavelengths in the visible light range of 400-700 nanometers, wavelengths in the infrared light range of 700 to 1200 nanometers, wavelengths in the ultraviolet light range of 1-700 nanometers, wavelengths less than 800 nanometers, wavelengths greater than 800 nanometers, wavelengths equal to 800 nanometers or any other wavelength). As an example, infrared light absorption may be increased from 5-10 percent in conventional silicon image sensors to 80 percent, greater than 80 percent, 90 percent, greater than 90 percent, 95 percent, greater than 95 percent, 99 percent, or greater than 99 percent using plasmonic structures such as metal layer 34 of FIG. 4. Spectral tuning (i.e., tuning of peak wavelength Wp of graph 80 to a desired wavelength) of plasmonic image pixels such as plasmonic image pixel 32 may be achieved using a suitable patterning of metal layer 34 on p-type layer 40, as shown in FIG. 7.

Figure 7:
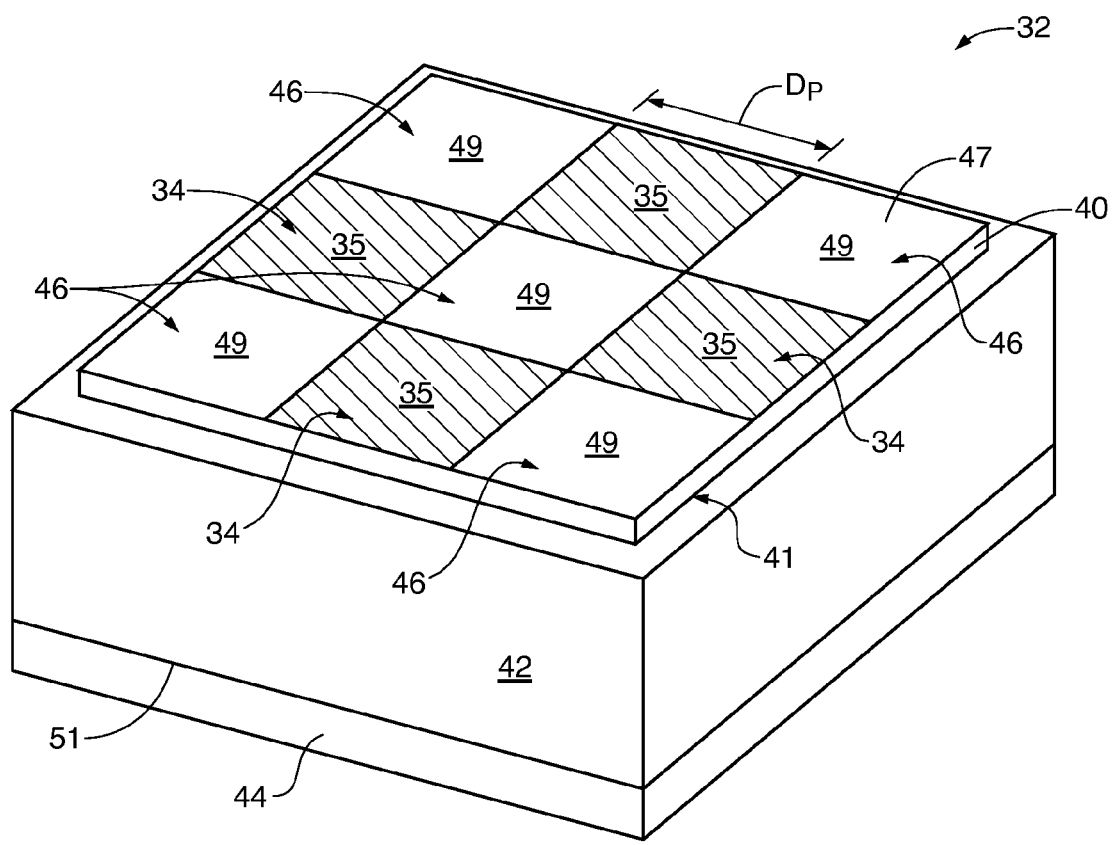
FIG. 7 is a perspective view of an illustrative plasmonic image pixel showing patterned plasmonic structures for spectral tuning in accordance with an embodiment of the present invention.

FIG. 7 is a perspective view of an illustrative plasmonic image pixel of the type that may be used in a plasmonic light collector such as plasmonic light collector 16 of electronic device 10 of FIG. 1. As shown in FIG. 7, plasmonic image pixel 32 may include a patterned metal layer such as patterned metal layer 34 formed on top surface 47 of a p-type layer such as p-type layer 40 (i.e., the surface of pixel 32 which may be exposed to incident light). Patterned metal layer 34 may be patterned such that surface 47 includes portions 35 that are covered by patterned metal layer 34 and exposed portions 49 (formed from openings 46 in patterned metal layer 34) that are not covered by patterned metal layer 34. P-type layer may be formed on top of an n-type layer such as n-type layer 42. As described in connection with FIG. 4, p-type layer 40 and n-type doped layer 42 may form a portion of p-n junction 41, a portion of which may be used to form a photodiode for detecting light captured by plasmonic image pixel 32. Multiple plasmonic image pixels such as plasmonic image pixel 32 may, if desired be formed from a single silicon die. Plasmonic image pixels 32 may be separated using separating structures such as separation structure 57 (see FIG. 4). Plasmonic image pixels 32 may include a reflective layer such as reflective layer 44 on bottom surface 51 of n-type layer 42 (i.e., the surface opposing the surface on which p-type layer 40 is formed). Reflective layer 44 may be formed from any suitable reflective material (e.g., gold plating, gold coating or other reflective layer).

Each plasmonic image pixel 32 may include surface features 34 (also referred to herein as metal layer 34, patterned metal layer 34, etc.) and exposed regions (portions) 49 on an upper surface of plasmonic pixel 32. Surface features 34 may, as an example, be formed from a patterned metal layer over p-type layer 40 (i.e., surface features 34 may be formed on p-type layer 40 by depositing a layer of a noble metal such as gold on p-type layer 40 and using e-beam lithography or other patterning methods to form openings such as openings 46 in the metal layer). Openings 46 in patterned metal layer 34 may be configured to allow light incident on pixel 32 to enter pixel 32 through exposed portions 49 of p-type semiconductor layer 40. Reflective layer 44 may be configured such that light that enters plasmonic image pixel 32 through openings 46 is reflected off of reflective layer 44 back towards openings 46 and metal layer 34. Electromagnetic fields generated near surface features 34 due to plasmons generated on surfaces of metal layer 34 may cause incoming light directed at surface features 34 to be redirected toward openings 46 and may cause light reflected off of reflective layer 44 towards openings 46 to be redirected toward inner surface 50 of patterned metal layer 34 such that light that enters plasmonic image pixel 32 is trapped within pixel 32 until it is absorbed in layer 40 or 42 (see FIG. 5).

As shown in FIG. 7, plasmonic image pixel 32 may include portions 35 covered by a patterned metal layer 34 having a rectilinear shape with four rectilinear metal portions 35 and openings 46 resulting in five exposed portions 49. Metal covered portions 35 may have a maximum lateral dimension such as lateral dimension Dp along the surface of p-type layer 40 equal to approximately one quarter of the wavelength of the light to be captured by spectrally tuned plasmonic light collector 32 (e.g., Dp=100 nanometer for capturing light having a wavelength equal to 400 nanometers, Dp=250 nanometer for capturing light having a wavelength of 1000 nanometers, etc.). The example of FIG. 7 in which plasmonic image pixel 32 includes metal covered portions 35 having a rectilinear shape with four rectilinear metal covered portions 35 and five exposed portions 49 is merely illustrative. Plasmonic image pixel 32 may include a patterned metal layer having more than five rectilinear portions, less than five rectilinear portions, five non-rectilinear portions (e.g., portions having substantially round shapes, portions having substantially oval shapes, or portions having irregular shapes), less than five non-rectilinear portions, more than five non-rectilinear portions, etc. Plasmonic image pixel 32 may include transparent portions such as exposed portions 49 having more than four rectilinear portions, less than four rectilinear portions, four non-rectilinear portions (e.g., portions having substantially round shapes, portions having substantially oval shapes, or portions having irregular shapes), less than four non-rectilinear portions, more than four non-rectilinear portions, etc. Plasmonic image pixels 32 may include equal numbers of transparent and metal covered portions, may include more metal covered portions than transparent portions, or more transparent portions than metal covered portions.

In the example of FIG. 7, the area ratio of portions of the top surface of plasmonic image pixel 32 covered by metal layer 34 to exposed portions 49 not covered by patterned metal layer 34 is 4/5. A 4/5 ratio of metal covered area to exposed area is merely illustrative and any other ratio may be used to tune spectrally tuned plasmonic image pixel 32 to trap light having a desired frequency (or wavelength).

As shown in FIG. 7, exposed portions 49 may all have substantially the same shape as all other transparent portions. Metal covered portions 35 may all have substantially the same shape as all other metal covered portions. Alternatively, for some desired spectral tuning properties of plasmonic image pixel 32, some exposed portions 49 may have different shape than other exposed portions and some metal covered portions may have different shape than other metal covered portions. In the example of FIG. 7, exposed portions 49 may have substantially the same shape as metal covered portions 35. Alternatively, for some desired spectral tuning properties of plasmonic image pixel 32, some exposed portions 49 may have different shape than some metal covered portions 35.

Figure 8:
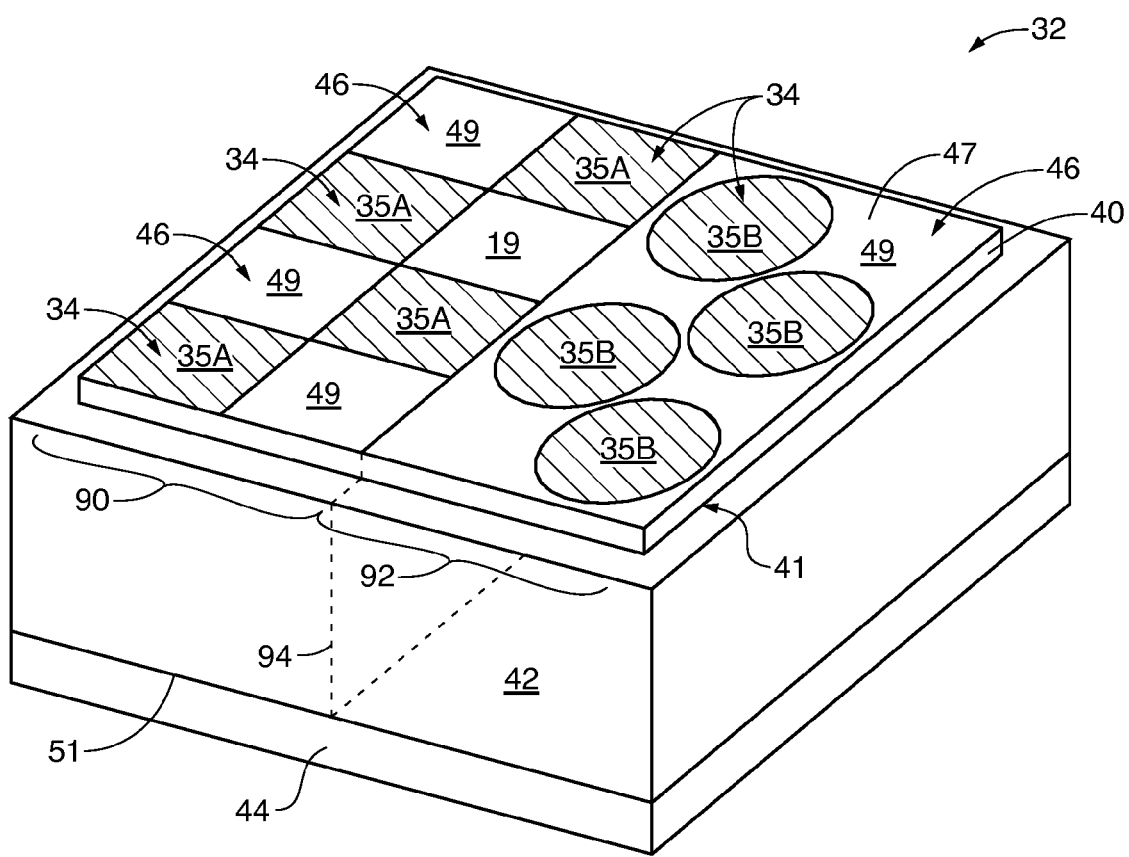
FIG. 8 is a perspective view of an illustrative plasmonic image pixel showing patterned plasmonic structures having multiple portions for spectral tuning in accordance with an embodiment of the present invention.

Exposed portions 49 of surface 47 not covered by patterned metal layer 34 and metal covered portions 35 of surface 47 covered with metal layer 34 may be configured to trap light of one frequency in one portion of plasmonic image pixel 32 and to trap light of another frequency in another portion of plasmonic image pixel 32 as shown in FIG. 8. FIG. 8 is a perspective view of an illustrative plasmonic image pixel 32 in which surface 47 of p-type dielectric layer 40 includes regions 90 and 92 respectively. As shown in FIG. 8, regions 90 and 92 may each include openings 46 in patterned metal layer 34 and exposed portions 49 not covered by patterned metal layer 34. Surface 47 of p-type layer 40 may have portions 35A and 35B covered by patterned metal layer 34 that have different patterned shapes in regions 90 and 92 respectively. In the example of FIG. 8, metal covered portions 35A formed from metal layer 34 have a substantially rectilinear shape in region 90 while metal portions 35B formed from metal layer 34 have a substantially round shape in region 92. Plasmonic image pixels 32 having plasmonic structures with differing shapes (or, if desired, differing sizes, differing ratios of metal covered to transparent areas, or other suitable differences) may be used to gather (or trap) light of one frequency in one portion of plasmonic image pixel 32 and to gather (trap) light of another frequency in another portion of plasmonic image pixel 32. For example, patterned metal layer 34 may guide light of one frequency into openings 46 in region 90 and guide light having a different frequency into opening 46 in region 92. In the case in which plasmonic image pixel 32 includes portions 35A and 35B of surface 47 having differing plasmonic structures, plasmonic image pixel 32 may include multiple photodiodes each formed in part from a portion of p-n junction 41 formed at the interface of p-type layer 40 and n-type layer 42. As an example, plasmonic image pixel 32 may include one photodiode associated with region 90 (for sensing light that has entered plasmonic image pixel 32 through openings 46 in region 90) and one photodiode associated with region 92 (for sensing light that has entered plasmonic image pixel 32 through openings 46 in region 92). Multiple photodiodes in plasmonic image pixel 32 may be separated by separating structures such as separating structure 94 within p-type layer 40 and n-type layer 42. The example in which plasmonic image pixel 32 includes two portions configured to capture light of two different frequencies is merely illustrative. Plasmonic image pixel 32 may include one portion as described in connection with FIG. 7, two portions, or may have more than two portions.

Forming plasmonic image pixels 32 using patterned metal layer 34 over p-type layer 40 and n-type layer 42 may help increase the flexibility of spectrally tuning plasmonic light collecting devices by enabling production of multiple plasmonic light collectors using wafer level processing techniques.

Various embodiments have been described illustrating electronic devices with imaging modules having plasmonic light collectors. Plasmonic light collectors may be configured to exploit the interaction between incoming light and plasmons generated on a surface of the plasmonic light collector to redirect the path of the incoming light. Redirecting the incoming light may include trapping the light within plasmonic image pixels in the plasmonic light collector by redirecting the light through transparent portions of the plasmonic image pixel. Light redirected into plasmonic image pixels may be reflected internal to plasmonic image pixels between a reflective layer and inner surfaces of plasmonic structures of the plasmonic image pixels. Plasmonic image pixels may include one or more doped dielectric layers. Doped dielectric layers may include p-type layers and n-type layers. A p-n junction formed from a p-type doped semiconductor layer and an n-type doped semiconductor layer formed between a reflecting layer and a patterned metal plasmonic structure may form a portion of a photodiode for detecting light trapped inside plasmonic image pixels. One or more plasmonic image pixels may be used to arrays plasmonic image pixels in plasmonic light collectors for electronic devices such as cameras, mobile phones, optofluidic microscopes, etc. Plasmonic image pixels may be smaller and more efficient than conventional image pixels. Plasmonic image pixels may be spectrally tuned to trap light of a chosen frequency (or wavelength) by altering the size, shape and pattern of transparent portions and metal layer plasmonic structure portions formed on the p-type substrate of the plasmonic image pixels.

The foregoing is merely illustrative of the principles of this invention which can be practiced in other embodiments.

What is claimed is:

1. A plasmonic image pixel for gathering light in a first frequency range and light in a second frequency range, comprising:
   a p-type semiconductor layer having a surface; and
   a patterned metal layer formed on the surface of the p-type semiconductor layer, wherein the patterned metal layer has a first region including first openings and a second region including second openings, wherein the first region of the patterned metal layer comprises a plurality of metal portions, wherein each metal portion in the plurality of metal portions has a first lateral width, wherein each of the first openings has a second lateral width, wherein the first lateral width is substantially equal to the second lateral width, wherein the patterned metal layer is configured to use plasmons to direct the light in the first frequency range and not light in the second frequency range into the first openings and to direct the light in the second frequency range and not light in the first frequency range into the second openings, and wherein a given one of the first openings is completely surrounded by four metal portions of the plurality of metal portions.

2. The plasmonic image pixel defined in claim 1, further comprising an n-type semiconductor layer adjacent to the p-type semiconductor layer, wherein the n-type semiconductor layer and the p-type semiconductor layer form a p-n junction that senses the light.

3. The plasmonic image pixel defined in claim 2 wherein the patterned metal comprises a noble metal.

4. The plasmonic image pixel defined in claim 3 wherein the light in the first frequency range has at least one wavelength and wherein the first openings have lateral dimensions substantially equal to a quarter of the wavelength.

5. The plasmonic image pixel defined in claim 4 wherein a first region of the p-n junction under the first openings senses the light in the first frequency range and wherein a second region of the p-n junction under the second openings senses the light in the second frequency range.

6. The plasmonic image pixel defined in claim 5, further comprising a reflective layer configured to reflect the light in the first and second frequency ranges towards the p-n junction.

7. An electronic device, comprising:
a p-type semiconductor layer;
an n-type semiconductor layer adjacent the p-type semiconductor layer;
a patterned metal layer adjacent to at least one of the p-type and n-type semiconductor layers, wherein the patterned metal layer is configured to use plasmons to direct light through at least one opening in the patterned metal layer into the p-type and n-type semiconductor layers; and
a reflective layer configured to reflect light that has passed through the p-type and n-type semiconductor layers back into the p-type and n-type semiconductor layers, wherein the patterned metal layer has first openings and is configured to use plasmons to route a portion of the light having a first color through the first openings into the p-type and n-type semiconductor layers, wherein the patterned metal layer has second openings and is configured to use plasmons to route a portion of the light having a second color that is different than the first color through the second openings into the p-type and n-type semiconductor layers, wherein the first openings comprise rectangular openings, wherein the second openings comprise round openings, and wherein a given one of the first openings is completely surrounded by four metal portions of the patterned metal layer.

8. The electronic device defined in claim 7 wherein the patterned metal layer has third openings and is configured to use plasmons to route a portion of the light having a third color that is different than the first and second colors through the third openings into the p-type and n-type semiconductor layers.

9. The electronic device defined in claim 8 wherein the first, second, and third openings are arranged to form an array of plasmonic image pixels having a Bayer color pattern.

10. The electronic device defined in claim 8 wherein the first, second, and third openings are arranged to respectively form first, second, and third rows of plasmonic image pixels.

11. The electronic device defined in claim 10 further comprising an imaging spectrometer, wherein the first, second, and third rows of plasmonic image pixels form a portion of the imaging spectrometer.

12. The electronic device defined in claim 10 further comprising an optofluidic microscope, wherein the first, second, and third rows of plasmonic image pixels form a portion the optofluidic microscope.

13. The electronic device defined in claim 7 wherein the p-type semiconductor layer and the n-type semiconductor layer adjacent the p-type semiconductor layer form a light sensor for receiving the light through the opening, wherein the light includes at least some light at a wavelength greater than 800 nm, and wherein the light sensor converts the light at the wavelength greater than 800 nm into electrical charge.

* * * * *